United States Patent [19]

LaCanfora

[11] 4,003,061
[45] Jan. 11, 1977

[54] PHOTOPLOTTER

[75] Inventor: Peter S. LaCanfora, Chelmsford, Mass.

[73] Assignee: Applicon Incorporated, Burlington, Mass.

[22] Filed: Oct. 31, 1975

[21] Appl. No.: 627,675

[52] U.S. Cl. ................................. 354/4; 346/108; 355/1; 355/71
[51] Int. Cl.² .................................... G03B 41/00
[58] Field of Search ................. 354/4, 5, 8–10, 354/12, 14; 355/1, 67, 71; 346/107 R, 108; 350/96 BC

[56] References Cited

UNITED STATES PATENTS

| | | | |
|---|---|---|---|
| 3,016,785 | 1/1962 | Kapany | 350/96 BC |
| 3,512,861 | 5/1970 | Schackert | 355/1 X |
| 3,565,524 | 2/1971 | Pabst et al. | 355/67 X |
| 3,686,675 | 8/1972 | Faul et al. | 355/1 X |
| 3,903,527 | 9/1975 | Frehling | 354/4 |

Primary Examiner—John Gonzales
Attorney, Agent, or Firm—Schiller & Pandiscio

[57] ABSTRACT

A photoplotter includes an image-projecting system movable with respect to a photosensitive material at relatively fast and efficient speeds and over relatively large areas. The photoplotter comprises a coherent fiber optic bundle for transmitting an image from the image-defining optics to the image-projecting system. The image can be moved over selective portions of the photosensitive material by moving the image-projecting system parallel to the material and rotated by rotating one end of the fiber optic bundle.

15 Claims, 8 Drawing Figures

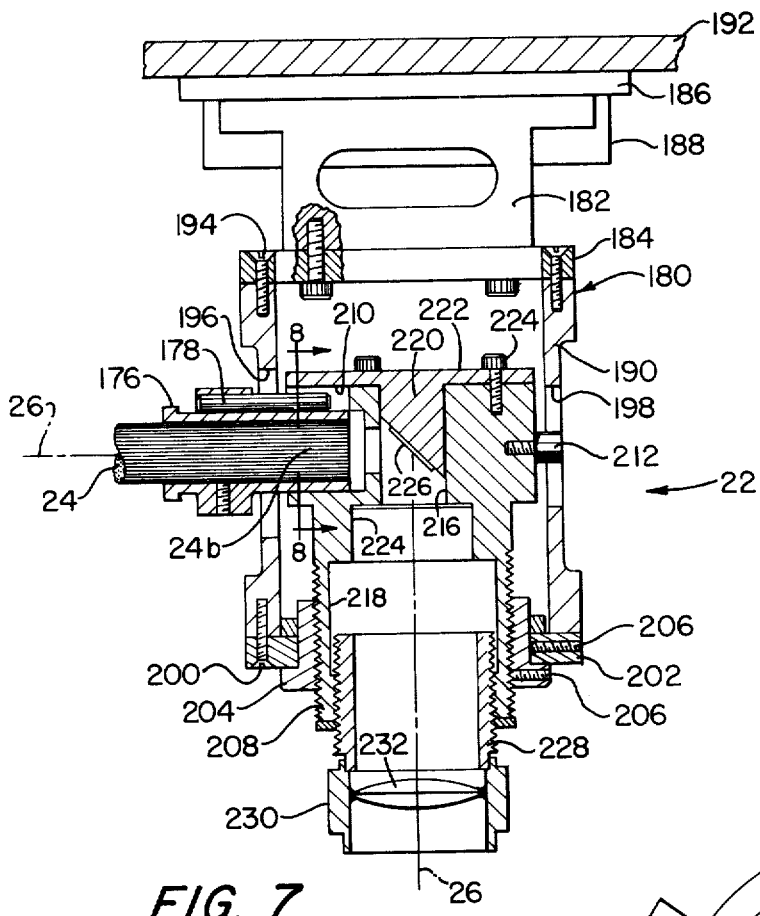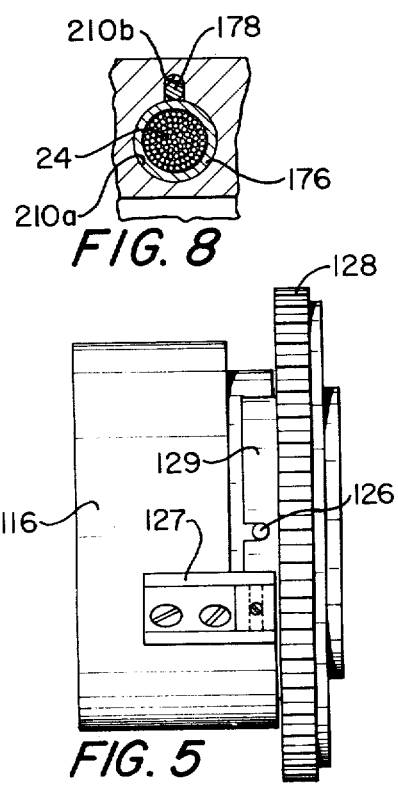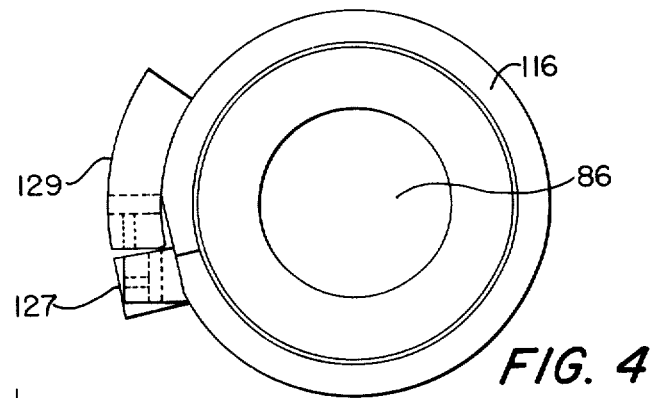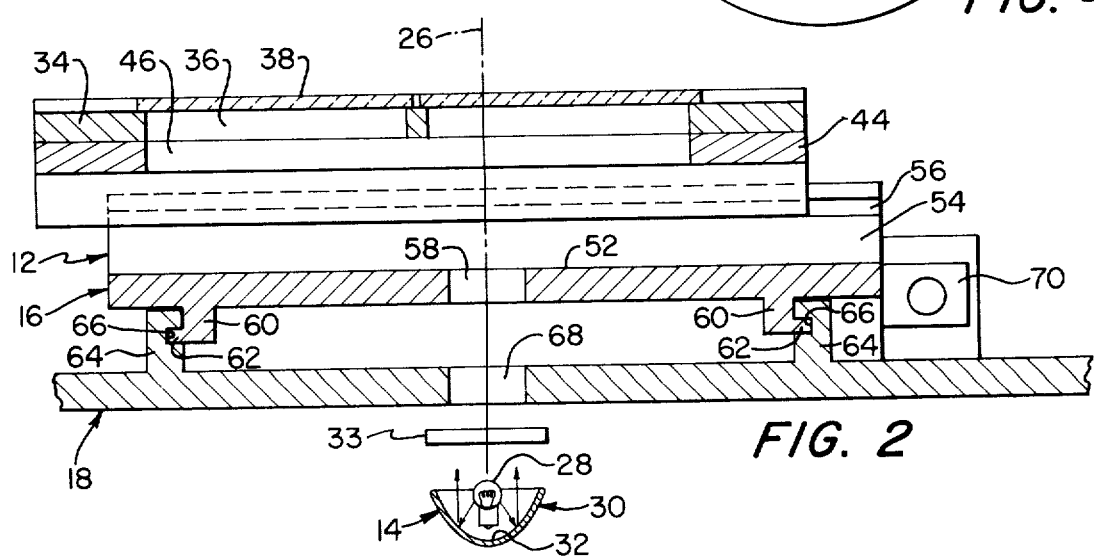

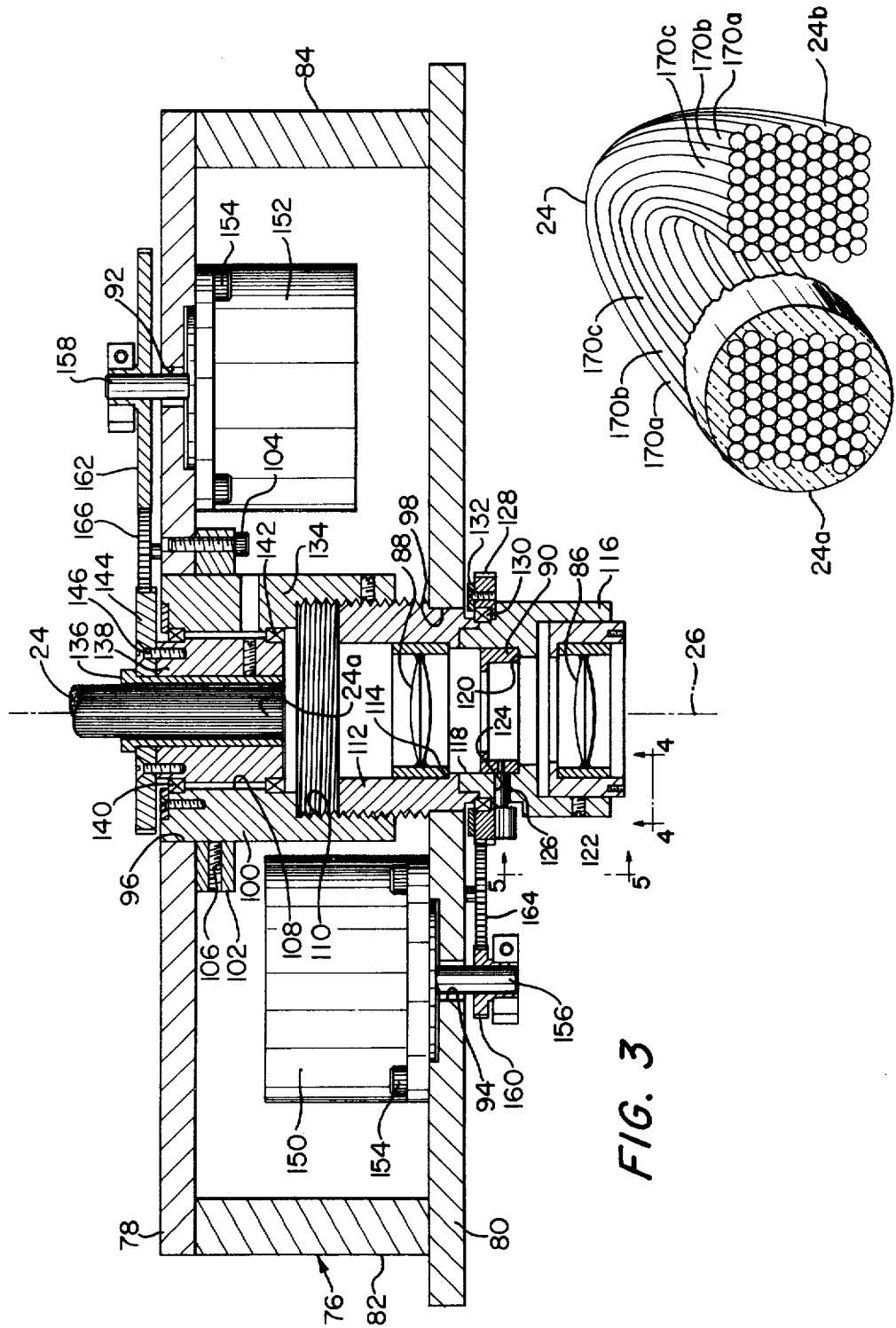

PHOTOPLOTTER

This invention relates to photoexposure devices and more particularly to photoplotters which are used for accurately exposing photosensitive surfaces to produce graphic displays.

Photoplotters are useful in making a variety of different photographic products, and are more particularly useful in the production of master art works which in turn are used in the manufacture of printed circuit boards, hybrids, integrated circuit elements and the like. Many of the presently available photoplotters expose discrete portions of a light sensitive surface by a moveable spot of light. The shape of the projected light spot is usually defined by an aperture which may have any desired shape. For example, the aperture may form an image of an alphanumeric character or it may form an image of a circle or square so that when the image is focused onto and moved with respect to the photosensitive surface, lines can be drawn on the surface.

One commercially available photoplotter is described in U.S. Pat. No. 3,330,182, issued to Heinz Gerber and Ronald Webster, and includes a light projector mounted on a carriage so as to be driven to and from any position above a light sensitive plotting surface in response to control signals supplied to the plotter by an associated computer. The light projector includes a large housing as well as other attachment and supporting structure for mounting various optical and mechanical equipment including a light source, a variable density filter, filter plates, aperture plates, several refracting and reflecting optical elements such as lenses and a mirror, gear mechanisms, servomotors, etc. Thus, a relatively large mass must be moved during plotting operations which are then relatively slow and inefficient. In order to compensate for such slowness and inefficiency, the maximum total area which can be exposed by the projector is relatively small.

Generally, it is the primary object of the present invention to overcome the aforementioned problems of the prior art.

More specifically, objects of the present invention are to provide for an improved photoexposure device in which the mass moved with respect to the photosensitive material is substantially reduced; to provide a photoplotter which operates at relatively faster and more efficient speeds; and to provide for photoplotter in which the maximum total area which can be exposed by the photoplotter is relatively large.

In order to accomplish the foregoing objects, the present invention comprises a photoplotter for exposing preselected portions of a photosensitive material which photoplotter includes means for defining at least one aperture, and means for forming an image of the aperture in a first image plane. A coherent fiber optic bundle is positioned so as to transmit the image of the aperture, from the first image plane to a second image plane at which the photosensitive material may be disposed. One end of the fiber optic bundle is capable of being axially rotated so as to rotate the image formed in the second image plane. Means are provided for varying the intensity of the image in the second image plane. Lastly, the device includes means for moving the image in the second image plane in either one or both of two mutually perpendicular directions.

Other objects of the invention will in part be obvious and will in part appear hereinafter. The invention accordingly comprises the apparatus possessing the construction, combination of elements, and arrangement of parts which are exemplified in the following detailed disclosure, and the scope of the application of which will be indicated in the claims.

For a further understanding of the nature and objects of the present invention, reference should be had to the following detailed description taken in conjunction with the accompanying drawings wherein:

FIG. 2 is a cross-sectional view taken along line 2—2 of the light projecting table shown in FIG. 1;

FIG. 3 shows a cross-sectional view taken through the image-receiving system;

FIG. 4 shows a partial bottom view, taken along line 4—4 in FIG. 3;

FIG. 5 shows a partial side view taken along line 5—5 of FIG. 3;

FIG. 6 shows a perspective view of a fiber optic bundle similar to the one utilized in the FIG. 1 embodiment;

FIG. 7 shows a cross-sectional view taken through the image projecting system utilized in the FIG. 1 embodiment; and FIG. 8 shows a cross-sectional side view taken along line 8—8 of FIG. 7.

In the drawings, like numerals refer to like parts.

Figure 1:
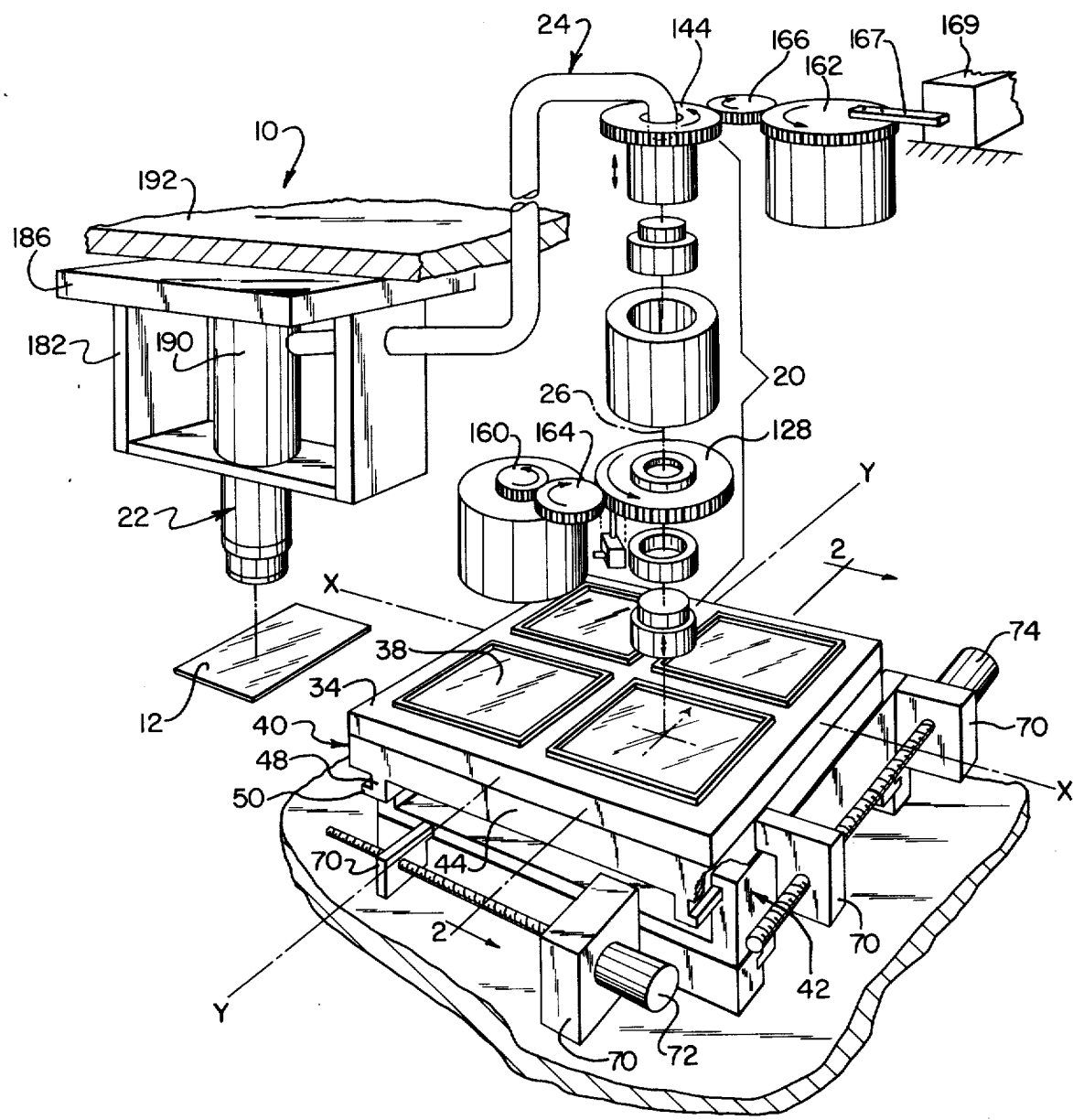
FIG. 1 is a perspective view, partially exploded and partially in schematic form, of the preferred embodiment of the invention.

Turning to FIGS. 1 and 2, a photoexposure device or photoplotter 10, made in accordance with the present invention, can be used to expose the surface of a photosensitive material 12 disposed in the image plane of the photoplotter. As used herein, the term "photosensitive material," can be any material sensitive to a portion of the electromagnetic spectrum, such as a light sensitive film or photosensitive emulsion. Generally, when making negatives for printed circuit boards, integrated circuit elements or other similar negatives, the photosensitive material usually selected and used has a high contrast with relatively little or no gray scale. However, by using a photosensitive material having a significant gray scale, photoplotter 10 could be used to shade areas by drawing in varying shades of gray by varying the intensity of the emitted beam from the photoplotter.

Photoplotter 10 includes illumination system 14 (shown in FIG. 2) disposed within light projection table 16, which in turn is mounted on stationary base support 18. The photoplotter also includes image-receiving optical system 20 positioned above the table; image-projecting optical system 22 spaced from the image receiving system and positioned to project an image onto the image plane in which the photosensitive material 12 is disposed; and a light conducting cable or fiber optic bundle 24 for optically connecting the image-receiving system 20 with the image-projecting system 22.

Illumination system 14 is disposed below table 16 and positioned so as to direct a beam of radiation along path 26 toward image-receiving system 20. System 14 includes lamp 28 mounted by any known means (not shown) so that it is optically aligned with and remains stationary with respect to image-receiving system 20 during the operation of the device. Preferably, system 14 includes means for not only forming and directing the beam toward image-receiving system 20 but for also making the beam of substantially uniform intensity throughout its cross-sectional area. In the preferred embodiment, such means are provided in the form of curved reflector 30 which is provided with concave, specularly reflective surface 32 positioned with respect to lamp 28 so as to reflect radiation emitted by the lamp to form the beam along path 26. The lamp provides radiation within the region of the spectrum to which photosensitive material 12 is maximally sensitive. Tungsten-halogen lamps are preferred, although other types of lamps can be used as will be apparent to those skilled in the art. System 14 also includes shutter mechanism 33 for controlling the transmission of the beam of radiation from the system along the path 26. Shutter mechanisms are well known in the art and thus mechanism 33 will not be described in great detail.

Table 16 is secured to base support 18 so that the former is movable in either one of two mutually perpendicular directions with respect to the latter. The table includes planar top 34 having at least one and preferably a plurality of windows 36, each of which is adapted to receive a corresponding aperture plate 38, the latter being provided with one or more image-defining apertures.

Table 16 is constructed so that top 34 and the aperture plates mounted thereon, are movable within the plane defined by the planar top relative to beam path 26. Preferably, the plane in which the top 34 moves is substantially perpendicular to the beam, although the plane of movement of the top and plates can vary from the normal. In order to move top 34 together with aperture plates 38 in the plane of movement, the top is mounted on upper and lower movable stages 40 and 42, respectively, which are movable in two mutually perpendicular directions, which for convenience will be referred to as the X and Y directions.

Upper stage 40 which directly supports top 34 is provided with planar portion 44 having an aperture 46 which is disposed so as to transmit the beam along path 26, regardless of the position of stage 40. Upper stage 40 is preferably attached to lower stage 42 by a tongue and groove arrangement, although other arrangements will be known to those skilled in the art. The bottom of planar portion 44 is formed with a pair of elongated ridges 48 disposed in a substantially parallel relationship with respect to one another as well as to the Y direction and are preferably disposed near opposite edges of planar portion 44 so that they do not interfere with the beam transmitted along path 26 regardless of the position of stage 40. Each ridge 48 is provided with a horizontally disposed lip or tongue 50 which extends outwardly from the ridge to slidingly cooperate with lower stage 42 so that the upper stage is movable relative to the lower stage in the Y direction.

Bottom stage 42 includes planar portion 52, the top of which is provided with a pair of rails 54, the latter being provided with horizontally disposed elongated groove 56 for cooperating with a corresponding one of lips 50 of upper stage 40. Planar portion 52 of bottom stage 42 also comprises an elongated aperture 58 which extends along the X-direction. Aperture 58 is disposed so as to transmit the beam along path 26 regardless of the position of stage 42. Bottom stage 42 is preferably attached to base support 18 in a manner similar to the tongue and groove arrangement previously described. Specifically, the bottom of planar portion 52 of stage 42 is formed with a pair of elongated ridges 60 which are disposed in a substantially parallel relationship with respect to one another as well as to the X direction and are disposed near opposite edges of planar portion 52 so that they do not interfere with the beams transmitted along path 26 regardless of the position of stage 42. Each ridge 60 is provided with a horizontally disposed lip or tongue 62 which extends outwardly from the ridge so as to slidingly cooperate with support 18 so that the bottom stage is movable with the top stage relative to support 18 in the X direction.

The top of support 18 includes a pair of rails 64, each of which is provided with a horizontally disposed groove 66 for cooperating with a corresponding one of the lips 62 of lower stage 42. Support 18 also includes an aperture 68 which is disposed so as to transmit the beam along path 26 so that the beam can be transmitted through apertures 46 and 58, through the aperture plate 38 positioned in path 26 to image-receiving optical system 20.

In order to move selectively each aperture of plates 38 into and out of path 26, table 16 is provided with means for moving the upper and lower stages 40 and 42 in the X and Y directions. More particularly, each stage is provided with a bracket 70 having a screw-threaded aperture, which is in turn adapted to receive and follow the screw threaded drive shaft of X and Y reversible, stepping drive motors 72 and 74, respectively.

Image-receiving optical system 20 is positioned above the table 16 so that it receives the image of the aperture of aperture plate 38 through which beam 26 passes. Referring to FIG. 3, the image-receiving optical system 20 is mounted in a housing 76. The latter includes upper plate 78, lower plate 80, and at least two side plates 82 and 84, all of which are secured together and mounted so as to be stationary with respect to the base support 18, in any manner well known in the art. Housing 76 is adapted to support an objective lens system 86, relay lens systems 88, iris mechanism 90 and one end 24a of the fiber optic bundle 24.

Upper and lower plates 78 and 80 are each provided with a hole 92 and 94, respectively, and centrally located apertures 96 and 98, respectively, the latter being coaxially aligned with one another and with path 26. Positioned in centrally located aperture 96 of upper plate 78 is hollow tubular bushing 100. The latter is secured to housing 76 by annular collar 102 which in turn is secured to upper plate 78 by screws 104 (one of which is shown in FIG. 3). A tight-fitting engagement is provided between collar 102 and bushing 100 by set screw 106. Bushing 100 is provided with central bore 108 at its upper end and counter bore 110 at its lower end, both bore and counterbore being coaxially aligned with path 26. Counter bore 110 is preferably threadedly coupled to the upper end of hollow tubular clamp member 112, which in turn extends through and is secured in aperture 98 of the lower plate 80 in any known manner, such as press fitting, cementing or the like. Clamp member 112 is provided with internal, raidally directed shoulder 114 for supporting relay lens system 88. The bottom of clamp member 112 is fixedly secured to iris and lens housing 116 so that both clamp member 112 and housing 116 are coaxial with one another as well as with path 26. Housing 116 is provided with internal bore 118 having inner radially directed shoulder 120 for supporting iris mechanism 90 at its upper end and is counter bored at its lower end as indicated at 122 for supporting lens system 86. The wall of lens housing 116 above inner shoulder 120 is provided with arcuate slot 124 which extends part of the way around housing 116 through a plane perpendicular to path 26. Iris mechanisms are well known in the art and thus mechanism 90 will not be described in detail. Generally, mechanism 90 includes a pin 126 which extends through arcuate slot 124 and is adapted to be rotated in slot 124 about an axis defined by path 26. The iris mechanism includes a diaphragm or aperture stop (not shown) whose diameter can be varied by rotating pin 126 between one position at one end of the slot 124 where the beam is transmitted along path 26 through the mechanism without appreciable loss of intensity and a second position at the other end of the slot 124 where there is little or no image transmission. Iris pin 126 is affixed to radial extending portion 127 which in turn is attached to spur gear 128 (see FIGS. 4 and 5). The latter is coaxially mounted on housing 116 by means such as radial bearings 130, which are held in place by retaining ring 132 so that gear 128 is free to rotate about path 26 with respect to clamp mechanism 112 and iris and lens housing 116. Rotation of iris pin 126 is limited by the arcuate length of slot 124, which typically is between 90° and 180°, and further by rotation of extending portion 127 into contact with limit stop 129 provided on housing 116. Rotation of spur gear 128 rotates pin 126 so as to open and close the iris mechanism wherein the intensity of the beam passing through objective lens system 86 to relay lens system 88 varies. Both lens systems 86 and 88 comprise one or more lenses, each of which may include a single or multiple components as well known in the art. Preferably, both systems comprise 1:1 transfer lenses. Such lenses are well known and generally are of the type which will transfer an image from one image plane to another without substantial magnification, minification, distortion or loss of intensity. Lens systems 86 and 88 are positioned relative to one another and path 26 so as to form an image of the beam received from table 16, in image plane 134.

Positioned in image plane 134, coaxially with respect to path 26, is end 24a of fiber optic bundle 24. In order to maintain end 24a of bundle 24 in plane 134 and rotate it about the path of beam 26, the end of the bundle is rotatably mounted in central bore 108 of bushing 100. In the preferred embodiment, end 24a of bundle 24 is fixedly-secured in tubular sleeve 136 which in turn is fixedly secured within hollow cylindrical shaft 138. The latter is rotatably mounted in bore 108 by upper and lower bearings 140 and 142, respectively, the bearings being retained by any known means as well known in the art. The upper end of shaft 138 is attached to spur gear 144 with screws 146.

In order to rotate spur gear 144, as well as spur gear 128, means are provided for selectively driving each of the gears. In the preferred form a first reversible motor is provided, shown schematically at 150, for rotatably driving spur gear 128 in either direction to open and close iris mechanism 90 and a second reversible motor is provided shown schematically at 152 for rotatably driving spur gear 144 in either direction to rotate end 24a of bundle 24 positioned in image plane 134. Both motors are preferably DC electric stepping motors although it will be obvious that other types of motors, such as pneumatic or the like, can be used. Motors 150 and 152 are mounted on lower and upper plates 80 and 78 respectively, by screws 154, so that their respective motor shafts 156 and 158 extend through corresponding holes 92 and 94 of the upper and lower plates of housing 76. The ends of motor shafts 156 and 158 are provided with drive gears 160 and 162, respectively, which are adapted to rotate with the corresponding shaft. Each of drive gears 160 and 162 is connected to corresponding spur gears 128 and 144 by intermediate gear train means such as gears 164 and 166, respectively, although any gear train arrangement can be used depending on the rotational speed and power output of motors 150 and 152, and the amount of maximum radial rotation desired for each of the spur gears 128 and 144.

The rotation of the end 24a of bundle 24 need not be greater than 360°. In order to limit the rotation of the end 24a of bundle 24, gear 162 is provided with limit stop 167 which rotates into and out of engagement with a rigidly supported rotation stop 169 between the two extreme positions (see FIG. 1). Preferably stops 167 and 169 limit the rotation of end 24a of the fiber optic bundle to less than about 180°.

The image formed in the image plate 134 is transmitted from end 24a of bundle 24 to its opposite end 24b with little or no distortion. Coherent fiber optic bundles are well known and preferably include a plurality of extremely thin optical fibers or filaments of light conductive material, typically glass. Typical diameters of the fibers may range from one or two microns to fifty or more microns. At these small diameters, materials such as glass are quite flexible and thus the bundle of optical fibers constitute a flexible light pipe. As well known, each fiber is coated or clad with a thin layer of material which has a lower index of refraction then the material of the fibers. For example, typically the core or fiber material is made of a glass having an index of refraction of 1.72 while the cladding is made of glass material having an index of refraction equal to 1.42. These indices of refraction will provide a numerical aperture in the order of 0.8. Since the total internal reflection occurs at the core-cladding interface, contact between the outer surfaces of the coated fibers will not frustrate the total internal reflection if the cladding is thick enough. The coherent fiber optic bundle shown in FIG. 6 illustrates the basic property of the bundle of transmitting an image from one end of the bundle to the other end. If the bundle is constrained at both ends so that each fiber 170, which is disposed in and separated from the other fibers by cladding 172, occupies the same relative position at each end, the bundle may be bent without affecting its image transmitting properties. Thus, where fibers 170a, 170b, 170c etc., are in opposite order at each end of the bundle, the image will be transmitted from one end of the bundle to the other relatively undistorted. As well known in the art, to increase the resolution of the image transmitted the number of fibers per unit of cross-sectional area is increased, by, for example, reducing the diameter of each individual fiber. The image is transmitted over bundle 24 from image-receiving optical system 20 to image-projection optical system 22.

Referring to FIG. 7, opposite end 24b of bundle 24 is secured in sheath 176. Sheath 176 is provided with locating pin 178, the purpose of which will be more obvious hereinafter. End 24b is secured to carriage 180, the latter comprising suitable supporting structure such as side plates 182, a top plate or head member 186 (of a linearized motor 188) and a lower plate 184 for supporting housing 190. Linearized motors are well known in the art and by way of example, are described in U.S. Pat. Nos. 3,376,578 and 3,457,482. Generally, head member 186 is adapted to magnetically couple with stationary plate member 192, which is positioned in a parallel relationship with material 12, so that carriage 180 moves parallel to material 12 (shown in FIG. 1). Housing 190 is secured to lower plate 184 by screws 194 and is provided with first aperture 196 for receiving end 24b of bundle 24, and a second aperture 198.

The lower end of housing 190 is secured by screws 200 to clamping ring 202 which in turn is secured to collar 204 by screw 206. Collar 204 is provided with internal screw threads so as to receive the tubular member 208. The latter is provided with a cavity 210 which cooperates with sheath 176 and locating pin 178 so that if the end is removed and reinserted in the aperture, no misorientation of an image transmitted through bundle 24 will occur. More particularly, as shown in FIG. 8, aperture 210 includes a portion 210a which is substantially of circular cross-section for receiving sheath 176 and a smaller portion 210b adjacent portion 210a for receiving locating pin 178.

The exterior portion of tubular member 208 is also provided with positioning pin 212 which extends through aperture 198 of housing 190 so that the orientation of tubular member remains fixed with respect to central axis of housing 190. Tubular member 208 is provided with an internal bore 214 which is of reduced diameter at its upper end 216 and counter bored at its lower end 218. The upper end 216 is adapted to receive the extension 220 of a mounting plate 222 secured to tubular member 208 by screws 224. The extension 220 includes a reflector 226 which reflects the beam of radiation transmitted through bundle 24 at an approximate 90° angle so that beam will be transmitted along the central axis of tubular member 208. The counterbore at the lower end 218 is connected to mounting ring 228. The lower end of ring 228 is connected to lens ring 230 which supports the objective lens system 232 coaxially with the path 26 of the beam of radiation. The system 232 may include one or more types of lens and/or one or more lens components, as well known in the art. The system 232 focuses an image provided at the end 24b of bundle 24 and reflected off of reflector 226 onto material 12 disposed therebelow. In order to focus the image, ring 204 is coupled to the outside of the lower end 208 so that rotation of the ring relative to the tubular member moves objective lens system 232 up or down so as to change the focus of the provided image on material 12.

The operation of the device will now be described. It will be understood that all operations herein described can be done manually by separate switching devices (not shown) connected to lamp 28, shutter 33, motors 72, 74, 150 and 154, and the linearized motor 188, or operated by an information storage and retrieval system (now shown), such as any one of the several minicomputers presently commercially available, by connecting the lamp and motors through anyone of several interconnect systems in a manner which is well known in the art.

When it is desirable to produce an artwork, photosensitive material 12 is placed in position below the image projecting optical system 22. The system 22 is moved to any desired position by energizing linearized motor 188. The particular image to be projected onto the material 12 is determined by the aperture opening of the aperture plate 38 which is disposed in the beam path 26 and the particular orientation of end 24a of fiber optic 24. When a particular aperture opening on plate 38 is desired which is not in the path 26, either or both motors 72 and 74 are energized in order to move the top 34, so that the particular aperture opening is moved into the path 26. If it is necessary to rotate the image projected onto the material 12, motor 152 is energized so that the end 24a of bundle 24 is rotated about the path 26 of a sufficient amount in order to rotate the image projected onto the material to the desired orientation.

The particular exposure is determined in part by the intensity of the beam projected onto material 12. This may be determined by the aperture stop provided by iris mechanism 90. The aperture stop is adjustable by energizing reversible motor 150 which opens and closes the iris mechanism to the aperture stop desired. Finally, the exposure time is controlled by energizing shutter 33 to an open position for the period of time desired.

By selectively energizing shutter 33 and various motors, discrete portions of material 12 can be exposed to produce various types of artwork, such as master art works utilized in the production of printed circuit boards and integrated circuit elements.

For example, where it is desirable to draw lines of equal width and intensity an aperture opening of plate 38 is selected which is of a circular or square configuration. Lamp 28 is energized and the iris mechanism is then set by motor 150 so that the desired intensity will be provided. The image projection optical system is then moved relative to material 12, and shutter 33 is energized when the system 22 is over the discrete portions of material in which the line is to be drawn.

It will be apparent therefore, that an art work can be produced by moving only the image projection optical system 22 relative to material. Typically, system 22 weighs 0.5 kgm. and thus can be moved relatively faster and thus over a greater area than was previously achieved by moving the carriages of such systems as the one described in U.S. Pat. No. 3,330,182.

Since certain changes may be made in the above apparatus without departing from the scope of the invention herein involved, it is intended that all matter contained in the above description or shown in the accompanying drawing shall be interpreted in an illustrative and not in a limiting sense.

What is claimed is:
1. A device for exposing selective portions of a photosensitive surface to produce a graphic display thereon, said device comprising;
    means for defining at least one aperture;
    means for forming an image of said aperture in a first image plane;
    a coherent fiber optic bundle for transmitting said image from said first image plane to a second image plane;
    means for rotating one end of said coherent fiber optic bundle so as to rotate said image in said second image plane; and
    means for moving said image in said second image plane in either one of two mutually perpendicular directions.
2. A device in accordance with claim 1, wherein said means for defining at least one aperture comprises a plate having a plurality of apertures.
3. A device in accordance with claim 2, further including means for directing illumination through said aperture, and mounting means for supporting said plate so as to move said plate through the optical axis defined by the path of illumination when said illumination passes through said aperture to said first image plane.

4. A device in accordance with claim 3, wherein said mounting means is movable in either one of two mutually perpendicular directions in a plane substantially perpendicular to said optical axis.

5. A device in accordance with claim 3, wherein said mounting means includes first and second stages and means for moving each of said stages in a corresponding one of two mutually perpendicular directions in a plane substantially perpendicular to said optical axis.

6. A device in accordance with claim 5, wherein said means for moving each of said stages includes a reversible motor.

7. A device in accordance with claim 1, further including means for mounting said fiber optic bundle so that said one end of said bundle is coplanar with said first image plane.

8. A device in accordance with claim 7, wherein said means for rotating said one end of said fiber optic bundle includes means for limiting the rotation of said bundle to less than about 180°.

9. A device in accordance with claim 7, wherein the other end of said fiber optic bundle is rotatably fixed.

10. A device in accordance with claim 9, wherein said means for moving said images in said second image plane includes a linearized motor.

11. A device in accordance with claim 10, wherein said linearized motor includes a plate element and a head element, said head element being movable relative to said plate element and said other end of said fiber optic bundle being affixed to said head element.

12. A device in accordance with claim 11, wherein said means for moving further includes means for reflecting an image transmitted from said other end of said fiber optic bundle to said second plane.

13. A device in accordance with claim 1 including means for controlling the intensities of said image in said second image plane.

14. A device in accordance with claim 13 wherein said means for controlling the intensity of said image includes an iris mechanism.

15. A device in accordance with claim 14, further including means for adjusting said iris mechanism between an open position wherein said image is transmitted therethrough without substantial loss of intensity to a closed position wherein said image is transmitted therethrough with some loss in intensity.

* * * * *